United States Patent [19]

Ando

[11] Patent Number: 5,349,494

[45] Date of Patent: Sep. 20, 1994

[54] SEMICONDUCTOR DEVICE WITH CAPACITOR INSULATING FILM AND METHOD FOR FABRICATING THE SAME

[75] Inventor: Koichi Ando, Tokyo, Japan

[73] Assignee: NEC Corporation, Tokyo, Japan

[21] Appl. No.: 920,921

[22] Filed: Jul. 28, 1992

[30] Foreign Application Priority Data

Jul. 29, 1991 [JP] Japan ................................ 3-188512

[51] Int. Cl.$^5$ ..................... H01G 4/10; H01L 21/70
[52] U.S. Cl. ................................. 361/322; 361/313;
427/79; 257/532; 437/60
[58] Field of Search ............... 361/312, 313, 321.1,
361/322, 311; 29/25.42; 427/79; 257/296, 306,
311, 532, 535; 437/60

[56] References Cited

U.S. PATENT DOCUMENTS

| | | | |
|---|---|---|---|
| 4,143,393 | 3/1979 | DiMaria et al. | 361/322 |
| 4,746,630 | 5/1988 | Hue et al. | 437/235 |
| 4,882,649 | 11/1989 | Chen et al. | 361/313 |
| 4,980,307 | 12/1990 | Ito et al. | 437/40 |
| 4,990,463 | 2/1991 | Mori | 437/52 |
| 5,049,975 | 9/1991 | Ajika et al. | 257/764 |
| 5,091,761 | 2/1992 | Hiraiwa et al. | 257/306 |

OTHER PUBLICATIONS

European Search Report for Application No. EP 92112613 and annex thereto.

Relibility of Nano-Meter Thick Multi-Layer Dielectric Films on Poly-Crystalline Silicon, Proceedings of 25th Annual IEEE Reliability Physics Symposium (1987), pp. 55–59, by Y. Ohji, et al.

Compositional Depth Profile of a Native Oxide LPCVD MNOS Structure Using X-Ray Photoelectron Spectroscopy and Chemical Etching, J. Electrochem Soc.; Solid-State Science and Technology, Vol. 130, No. 3 (1983), pp. 691–699, by Wurzbach, et al.

Inter-Poly $SiO_2/Si_3N_4$ Capacitor Films 5 nm Thick for Deep Submicron LSIs, Extended Abstracts of the 20th (1988 International) Conference on Solid State Devices and Materials (1988), pp. 173–176, by J. Yugami, et al.

Primary Examiner—Bruce A. Reynolds
Assistant Examiner—Gregory L. Mills
Attorney, Agent, or Firm—Burns, Doane Swecker & Mathis

[57] ABSTRACT

A semiconductor device has a capacitor insulating film composed of a first and a second silicon nitride film. The surface of a lower electrode of impurity-doped polysilicon is transformed into the first silicon nitride film by thermal nitriding, and thereafter the second silicon nitride film is formed by chemical vapor deposition. An upper electrode is formed on the second silicon nitride film. A silicon oxide film may be formed on the second silicon nitride film by thermal oxidation. The capacitor insulating film which has a thickness of 5 nm or less in equivalent thickness of an oxide film reduces a leakage current and improves a long-term product reliability.

7 Claims, 4 Drawing Sheets

SEMICONDUCTOR DEVICE WITH CAPACITOR INSULATING FILM AND METHOD FOR FABRICATING THE SAME

BACKGROUND OF THE INVENTION (1) Field of the Invention

The present invention relates to a semiconductor device and a method for fabricating it, and more particularly to a structure of a capacitor insulating film and a method for fabricating it.

(2) Description of the Prior Art

Conventionally, as capacitor insulating films, there are used a silicon oxide film ($SiO_2$), a silicon nitride Film ($Si_3N_4$) and a composite film of these films (e.g., a double layered film of $SiO_2/Si_3N_4$, film of $SiO_2/Si_3N_4/SiO_2$). FIG. 1 shows the structure of one example of these conventional films. In FIG. 1, a lower electrode 3 having a predetermined shape and made of impurity-doped polysilicone (also called polycrystalline silicon) is formed on the surface of the silicon oxide film 5 on a semiconductor substrate 6. A silicon nitride film 2 having a thickness of about 10 nm is formed by chemical vapor deposition techniques so as to cover the surface of the lower electrode 3. Thereafter, the surface of the silicon nitride film 2 is thermally oxidized to be converted into a silicon oxide film 7 having a thickness of about 2–3 nm. Subsequently, an upper electrode 4 made of polysilicon is formed so as to cover the silicon oxide film 7. In the above structure, the capacitor insulating film is composed of the silicon nitride film 2 formed by the chemical vapor deposition and the silicon oxide film 7 formed by the thermal oxidation. The capacitor insulating film has a thickness of about 7–8 nm in equivalent thickness of an oxide film. Reference is made to "Y. Ohji et al., Proceedings of 25th Annual IEEE Reliability Physics Symposium (1987) p. "55

The conventional capacitor insulating film has the Following defects. The conventional silicon nitride film formed by the chemical vapor deposition contains many weak-spots so that a single silicon nitride film of 8 nm or less presents difficulties in its use as a stabilized capacitor insulating film with less leakage current. For this reason, a double layered $SiO_2/Si_3N_4$ film wherein the weak spots are covered by oxidation film on tile surface of the silicon nitride film is now widely used in the current DRAMs, etc. However, this double layered film, when it has a thickness of, 5 nm or less in equivalent thickness of an oxide film, also suffers from an abrupt increase in the leakage current. Reference is made to "J. Yugami et al., Extended Abstracts on the 20th Conference on Solid State Devices and Materials (1988) p.173"

Further, the chemical vapor deposition tends to introduce oxygen into the silicon nitride film. This introduction of oxygen is remarkable particularly in the initial process where the silicon nitride film grows on the oxide film. Also where a silicon nitride film is to be grown on polysilicone from a vapor phase, it will actually grow on the native oxide film formed on the polysilicone surface. Thus, it was difficult to form a stoichiometric silicon nitride film 10 nm or less thick on polysilicon by the chemical vapor deposition techniques. Reference is made to "J. A. Wurzbach and F. J. Grunthaner, J. Electrochem. Soc., Vol 130, No.3 (1983) p.691".

SUMMARY OF THE INVENTION

An object of the present invention is to provide a semiconductor device with a capacitor insulating film including a silicon nitride film formed by thermal nitriding.

Another object of the present invention is to provide a method for fabricating a semiconductor device comprising tile step of thermally nitriding the surface of a lower polysilicon electrode.

The semiconductor device according to tile present invention includes a capacitor insulating film composed of a silicon nitride film which is provided by thermally nitriding the surface of the lower electrode of polysilicon, and another silicon nitride film formed by the chemical vapor deposition.

The method for fabricating a semiconductor device according to the present invention includes the steps of forming a silicon nitride film by thermally nitriding the surface of a lower electrode made of polysilicon, and forming another silicon nitride film by the chemical vapor deposition. The thermal nitriding is carried out preferably in a nitriding atmosphere of any of nitrogen, ammonia, hydrazine, etc.

The silicon nitride film formed by chemical vapor deposition contains much oxygen. On the other hand, the silicon nitride film directly formed by thermal nitriding is stoichiometric and has a higher permittivity than the former. In equivalent thickness of an oxide film, therefore, the latter silicon nitride film actually has a larger thickness than tile former silicon nitride film. The silicon nitride film formed by tile thermal nitriding is more effective in reducing a leakage current.

The thermal nitriding enables to removal of the native oxide film existing between tile polysilicon film and the silicon nitride film formed by tile chemical vapor deposition in the semiconductor device structure fabricated by the conventional method. The capacitor insulating film according to the present invention is a film with improved reliability for dielectric breakdown.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF THE PREFERRED EMBODIMENTS

Figure 1:
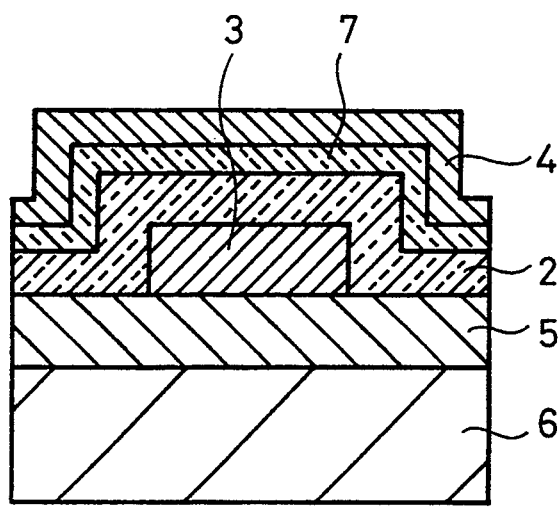
FIG. 1 is a sectional view of a semiconductor device For explaining the conventional semiconductor device structure and its fabrication method.

Now, referring to the drawings, an explanation will be given of embodiments of tile present invention. Throughout the following explanation, similar reference symbols or numerals refer to the same or similar elements in all figures of the drawings.

Figure 2:
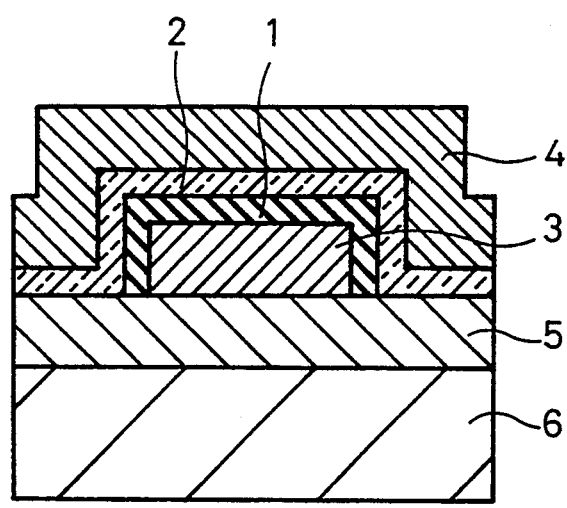
FIG. 2 is a sectional view of a semiconductor device for explaining a first embodiment according to the present invention.

FIG. 2 is a sectional view of tile structure of a semiconductor device according to the first embodiment of the present invention.

As seen from FIG. 2, a lower electrode 3 having a predetermined shape and made of impurity-doped polysilicon is formed on the surface of a silicon oxide film 5 on a semiconductor substrate 6. A capacitor insulating film covering the lower electrode 3 is composed of a silicon nitride film 1 formed by the thermal nitriding (thermal nitridation) and another silicon nitride film 2 formed by the chemical vapor deposition. The thickness of the silicon nitride film 1 is several nanometers and that of the silicon nitride film 2 is 4 nm or so. An upper electrode 4 made of polysilicon is formed on tile surface of the capacitor insulating film. If the capacitor insulating film is composed of only the silicon nitride Film 1, it is too thin so that the silicon nitride film 2 is added to the silicon nitride film 1. It should be noted that the silicon nitride film 1 is a stoichiometric film with less weak-spots.

Figure 3A:
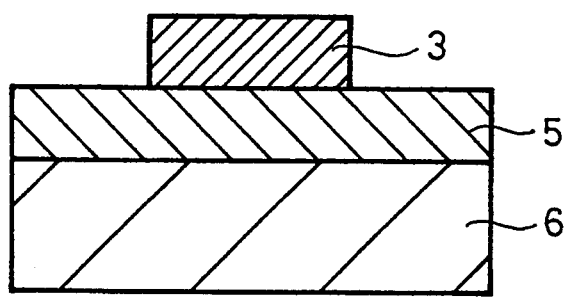
FIGS. 3A to 3C are sectional views of a semiconductor device for explaining main steps for tile fabricating method according to the first embodiment of the present invention.
Figure 3B:
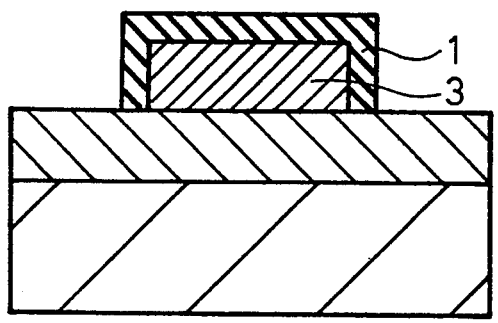
Figure 3C:
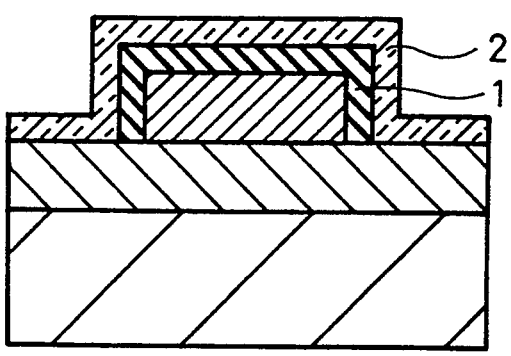

Referring to FIGS. 3A to 3C showing main process steps and FIG. 2, an explanation will be given of a method of fabricating the semiconductor device according to the present invention.

First, impurity-doped polysilicon is formed on the surface of the silicon oxide film 5 on the semiconductor substrate 6. The polysilicon is then patterned into a predetermined shape to form tile lower electrode 3 (Fig. 3A). Secondly, fast thermal nitriding at 850° C. for 60 seconds using a rapid thermal processing equipment is done, so that the silicon nitride film i having a thickness of several nanometers is formed on the surface of the lower electrode 3 (FIG. 3B) due to the thermal nitriding. Thereafter, another silicon nitride film 2 is deposited to a thickness of 4 nm or so, by the low pressure chemical vapor deposition, on the silicon nitride film 1 formed due to the thermal nitriding (FIG. 3C). Finally, polysilicon is deposited on the resultant surface by the low pressure chemical vapor deposition, and doped with impurities. The polysilicon is patterned to form the upper electrode 4 (FIG. 2). In this embodiment, tile capacitor insulating film has a thickness of about 4.5 nm in equivalent thickness of an oxide film.

Figure 4:
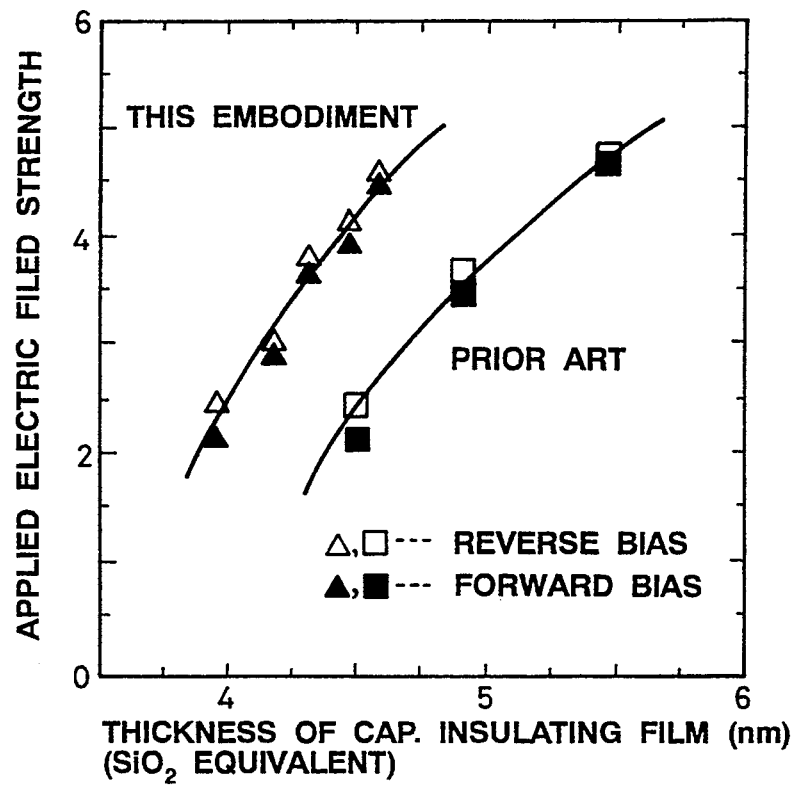
FIGS. 4 and 5 are graphs for explaining the effects of the first embodiment according to the present invention in comparison with the prior art.
Figure 5:
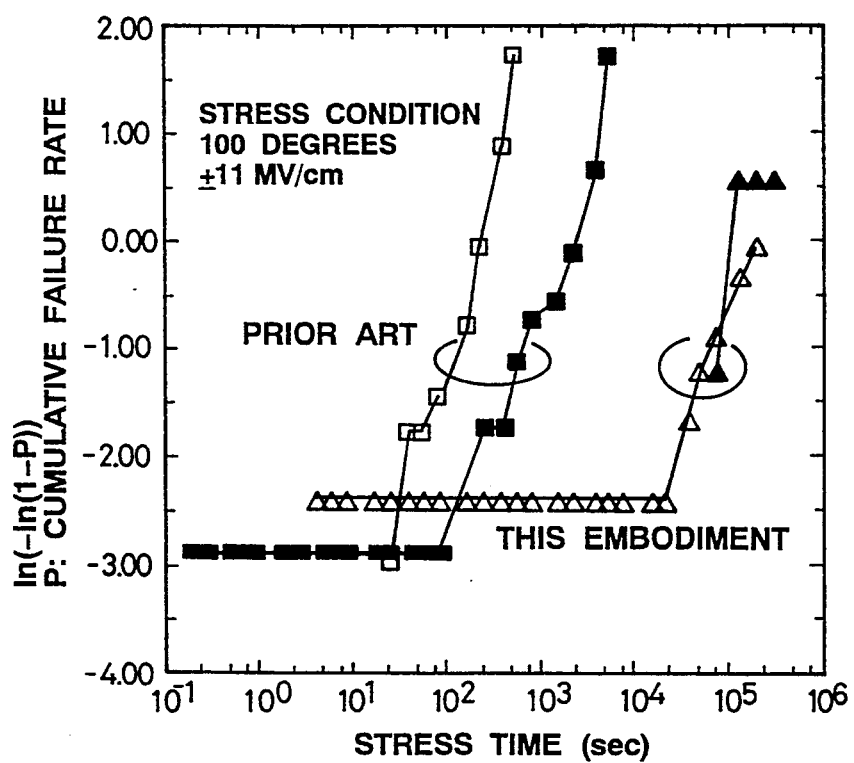

FIGS. 4 and 5 are graphs showing tile effects of this embodiment in comparison with tile semiconductor device including the conventional capacitor insulating film.

FIG. 4 shows the strength of the applied electric field versus the thickness of the capacitor insulating film in equivalent thickness of an oxide film. The strength of the applied electric field represents the value corresponding to the leakage current density of $10^{-8}$ A/cm$^2$. As can be seen from FIG. 4, with the same film thickness in terms of an oxide film, the applied electric field strength in this embodiment is higher by about 2 MV/cm than in the prior art. Thus, this embodiment provides an improvement in the leakage current characteristics over the prior art.

FIG. 5 shows Weibull distribution plots of a cumulative failure rate P versus a stress applying time when an electric field is applied to the capacitors including the respective capacitor insulating films according to this embodiment and the prior art. As apparent from the figure, the capacitor according to this embodiment provides a more excellent long-term reliability than the prior art.

Figure 6A:
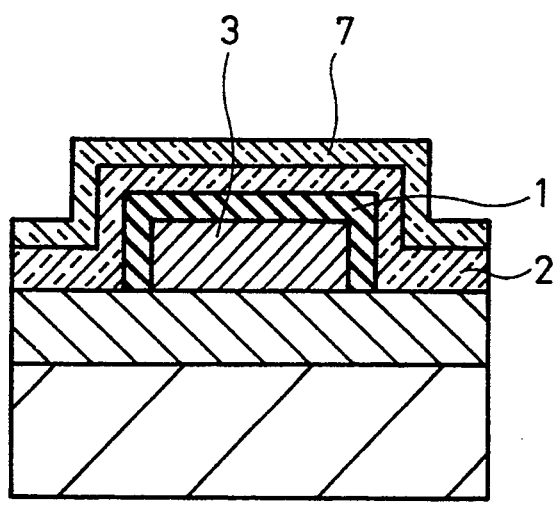
FIGS. 6A and 6B are sectional views of a semiconductor device for explaining steps for the fabrication method of a second embodiment according to the present invention.
Figure 6B:
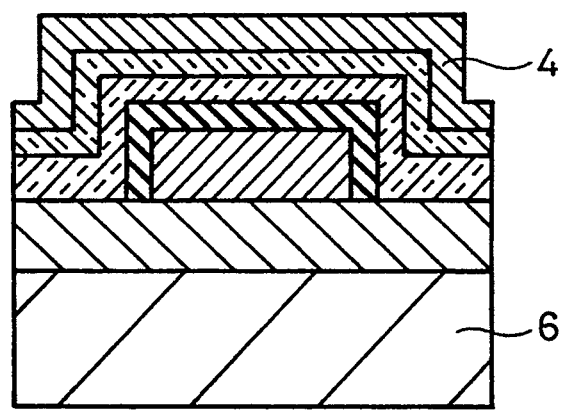

FIGS. 6A and 6B show process steps for explaining the semiconductor device according to a second embodiment of the present invention.

The method of fabricating the semiconductor device according to this embodiment is entirely the same as that in the first embodiment up to the step of FIG. 3C. Subsequently, a silicon oxide film 7 is formed by the thermal oxidation method on the surface of the silicon nitride film 2 formed by the chemical vapor deposition (FIG. 6A). Further, as in the first embodiment, finally, polysilicon is deposited on the silicon oxide film 7 by the low pressure chemical vapor deposition, and doped with impurities. The polysilicone is then patterned to form an upper electrode 4 (FIG. 6B).

This embodiment, in which tile silicon oxide film 7 is Formed by thermally oxidizing tile surface of the silicon nitride film 2 due to the chemical vapor deposition, provides a further improvement in the leakage current characteristic and long-term reliability over the first embodiment described above.

As described above, the semiconductor device according to the present invention has a capacitor insulating film including a silicon nitride film Formed due to the thermal nitriding. The method for fabricating it includes the step of thermally nitriding tile surface of a lower electrode of polysilicon to provide the silicon nitride film to be used as a part of the capacitor insulating film. Thus, the native oxide film on the lower electrode surface can be transformed into a silicon nitride film with reduced density of weak spots, reduced leakage current and improved long-term reliability.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor device comprising:
   a lower electrode of impurity-doped polysilicon formed on an electrical insulating film on a semiconductor substrate;
   a capacitor insulating film covering said lower electrode, said capacitor insulating film including a first silicon nitride film formed by thermal nitriding and a second silicon nitride film formed by chemical vapor deposition, said first silicon nitride film being disposed on essentially only said lower electrode and said second silicon nitride film being disposed on an entire surface of said semiconductor device; and
   an upper electrode covering said capacitor insulating film.

2. A semiconductor device according to claim 1, wherein said second silicon nitride film has a thickness of approximately 4 nanometers.

3. A semiconductor device according to claim 1, wherein said first silicon nitride film has a greater thickness than that of said second silicon nitride film as measured by capacitance of an equivalent thickness of a silicon oxide film.

4. A semiconductor device according to claim 1, wherein said capacitor insulating film further includes a silicon oxide film formed on said second silicon nitride film by thermal oxidation.

5. A semiconductor device according to claim 1, wherein said upper electrode is made of polycrystalline silicon.

6. A method for fabricating a semiconductor device having a lower electrode of impurity-doped polysilicon formed on an electrical insulating film on a semiconductor substrate, a capacitor insulating film covering said lower electrode, and an upper electrode covering said capacitor insulating film, comprising the steps of:

forming a first silicon nitride film essentially only on a surface of said lower electrode by thermal nitriding of said lower electrode after forming said lower electrode at a predetermined position on a surface of said electrical insulating film, said electrical insulating film being formed on said semiconductor substrate;

forming a second silicon nitride film by chemical vapor deposition to cover an entire resultant surface after a formation of said first silicon nitride film in the previous step; and forming said upper electrode to cover said second silicon nitride film.

7. A method for fabricating a semiconductor device according to claim 6, further comprising, after the step of forming the second silicon nitride film, tile step of forming a silicon oxide film on said second silicon nitride film by thermal oxidation.

* * * * *